(12) United States Patent
Liang et al.

(10) Patent No.: US 8,803,617 B2
(45) Date of Patent: Aug. 12, 2014

(54) OSCILLATORS AND CLOCK GENERATION

(75) Inventors: Jin Liang, Apex, NC (US); David Grant, Cambridge, MA (US); Larry Wofford, Cary, NC (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 13/598,251

(22) Filed: Aug. 29, 2012

(65) Prior Publication Data

US 2013/0057352 A1 Mar. 7, 2013

Related U.S. Application Data

(60) Provisional application No. 61/530,729, filed on Sep. 2, 2011.

(51) Int. Cl.
*H03K 3/03* (2006.01)
(52) U.S. Cl.
USPC .............................. 331/57; 331/185
(58) Field of Classification Search
USPC .................................... 331/57, 185
See application file for complete search history.

(56) References Cited

U.S. PATENT DOCUMENTS

| | | | |
|---|---|---|---|
| 5,923,222 A | 7/1999 | Russell et al. | |
| 6,515,550 B2 | 2/2003 | Demsky et al. | |
| 2008/0111639 A1* | 5/2008 | Ryckaert et al. | 331/57 |
| 2008/0252387 A1* | 10/2008 | Higashi | 331/57 |
| 2010/0253382 A1* | 10/2010 | Wang et al. | 324/771 |

* cited by examiner

*Primary Examiner* — Joseph Chang
(74) *Attorney, Agent, or Firm* — William B. Kempler; Frederick J. Telecky, Jr.

(57) ABSTRACT

Oscillator circuitry having a switching inverting amplifier arranged in a ring oscillator configuration of at least two stages. A bias generator for supplying the amplifiers of neighboring stages, is responsive to an enable signal to supply the amplifiers only when the enable signal is asserted. A first pair of transistors, coupled to an input of one of the amplifiers and the other coupled to an output of the amplifier, the transistors being driven in common by the enable signal such that when the enable signal is deasserted the transistors of the pair are turned on to impose conflicting levels at the input and the output such that the amplifier is forced to switch.

6 Claims, 3 Drawing Sheets

US 8,803,617 B2

OSCILLATORS AND CLOCK GENERATION

CROSS-REFERENCE TO RELATED APPLICATIONS

This patent application claims the benefit of U.S. Provisional Application No. 61/530,729, filed Sep. 2, 2011, which is incorporated herein by reference in its entirety.

FIELD OF THE INVENTION

This invention relates to oscillators, such as those which may be employed in the generation of the clock waveforms required by a micro-processor or micro-controller.

BACKGROUND OF THE INVENTION

Certain micro-controllers have been optimised for use in applications where power consumption is an important consideration, as will normally be the case when equipment is to be battery powered. A micro-controller will typically be at the center of a control system for such equipment, and if the power demand of the control system itself can be reduced, then the time for which the equipment may remain powered by a battery is correspondingly extended.

One technique for reducing the power demand of a micro-controller is to allow parts of the micro-controller to be disabled or even switched off entirely when they are not required to perform a control function. For example, if the equipment is in a stable state and it is known that no control parameters will need to be accessed or modified for some time, then the relatively power hungry memory access circuitry associated with the micro-controller may be powered down until needed. Similarly, the computational parts of the micro-controller circuitry may be powered down. Another technique for reducing power demand is by slowing down the operation of the micro-controller. Since data storage within semi-conductor devices is essentially a charge storage mechanism and data manipulation involves charging or discharging the storage nodes then clearly less energy is consumed if a micro-controller can be clocked more slowly and yet still provide the required control parameters in time, as again may be the case if the controlled equipment is currently stable.

The types of power saving measures described above have become known as putting all or parts of the micro-controller circuitry to sleep, and power optimisable micro-controllers having a variety of sleep modes have become available. The modes may include, a partial disabling or slowing of circuitry and indeed switching off circuitry all together (deep sleep). An advanced micro-controller may have circuitry blocks each of which is fed by a different clock, which therefore comprises a controller with different clock domains. These domains may be separately placed in the available sleep modes as the application permits.

The clocks for the various domains may be derived from a single oscillator and gated through to the different domains or in some designs a dedicated oscillator may feed a single domain. Thus in some applications it may be possible to consider switching off the oscillator all together as a way of saving even more power than just disabling a clock domain. Whether this is possible will depend to a large extent on the time taken by the oscillator to turn back on and stabilise, since clearly the restart period represents the minimum time for which such a deep sleep mode may be entered. If the time taken for an oscillator to restart and stabilise can be reduced, then the deep sleep mode may potentially be entered more often with a consequent advantageous power saving.

A typical approach to providing an oscillator is to take a circuit configuration that is unstable and therefore capable of oscillation. Oscillation is started by allow the arrangement to amplify noise within the circuit. U.S. Pat. No. 5,923,222 to Motorola shows that start-up may be improved if suitable initial conditions within the normal operating range of the circuit are provided prior to noise amplification and United States Patent Application Published under number 2002/167364 recommends applying as initial input conditions for one stage of a ring oscillator levels that would be encountered once normal oscillation had commenced.

SUMMARY OF THE INVENTION

A general object of the invention is a ring oscillator having at least two stages.

An aspect of the invention includes oscillator circuitry comprising a switching inverting amplifier arranged in a ring oscillator configuration of at least two stages. A bias generator for supplying the amplifiers of neigbouring stages, said bias generator being responsive to an enable signal to supply the amplifiers when the enable signal is asserted and not to supply the amplifiers when the enable signal is deasserted. A first pair of transistors, one of said pair coupled to an input of one of the amplifiers and the other of said pair coupled to an output of said amplifier, said pair of transistors being driven in common by said enable signal such that when the enable signal is deasserted the transistors of the pair are turned on to impose conflicting levels at said input and said output such that said amplifier is forced to switch. A second pair of transistors, one of said pair coupled to an input of the other of the amplifiers and the other of said pair coupled to an output of said other amplifier, said second pair of transistors being driven in common by said enable signal such that when the enable signal is deasserted the transistors of the pair are turned on to impose conflicting levels at said other amplifier input and said other amplifier output such that said other amplifier is forced to switch. The neighbouring ring amplifiers providing said switching events to trigger ring oscillator oscillation thereafter.

In order that features and advantages of the present invention may be further appreciated some embodiments will now be described by way of example only and with reference to the accompanying diagrammatic drawings, of which:

DETAILED DESCRIPTION OF EXAMPLE EMBODIMENTS

Figure 1:
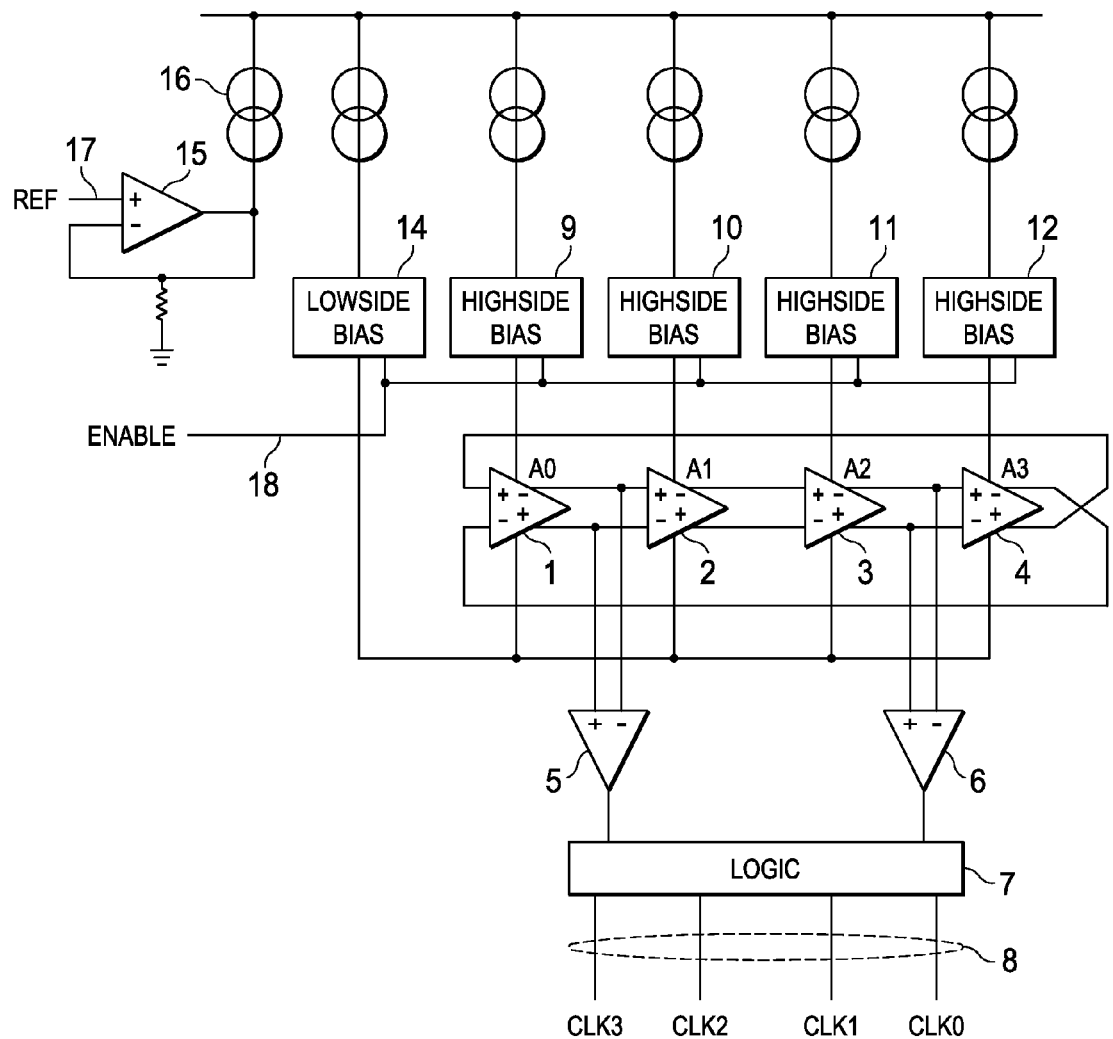
FIG. 1 represents an oscillator and clock generator in accordance with the present invention.

An oscillator (FIG. 1) for use with a micro-controller as a source of clock signals functions a basic four stage ring oscillator comprising four inverting amplifiers (A0, A1, A2, and A3) represented by amplifiers 1-4 in the figure. Since an even number of inverting stages is employed, when the output of A3 is fed back to A0, a cross-coupling inversion is employed. Differential amplifiers 5 and 6 are connected to the output pars of amplifiers A0 and A2 respectively and on to a decoding logic block 7 which derives four clock phases CLK0, CLK1, CLK2, and CLK3 which represent the four possible combinations of the two block inputs.

Amplifiers 1-4 are supplied from highside bias generators 9-12 and lowside bias generator 14. These bias supplies are themselves derived from a voltage to current generator 15, which is arranged to provide a current in current generator 16 in response to a reference voltage applied at an input 17. The highside generators are arranged to mirror the current in generator 16, thereby enabling the frequency of oscillation to be set by an appropriate choice of reference voltage applied at 17. The low side bias is also derived from a mirror of this current and is arranged so that a constant amplifier load is presented across a range of possible high side bias currents to set a desired amplifier output voltage swing. Thus far, it is anticipated that the general principles of such a circuit as that presently described will be familiar to those skilled in the art.

It is envisaged that the present circuit will be used as a source of clock signals, for example for a micro-controller in an application where the micro-control can be made to enter a deep sleep mode. To this end is it possible to enable or disable the bias generators, since it is self evident that when the generator are disabled by deasserting an enable signal normally maintained on line 18, bias current will no longer reach the amplifiers and as a consequence oscillation will cease.

Once the application requires that the micro-controller be brought out of deep sleep mode, the oscillation must be restarted. It will be appreciated that a straightforward reassertion of the enable signal on line 17 will suffice to restart the circuit. The bias supplies will be restored and the ring-oscillator eventually would restart. However if a conventional ring arrangement were employed, the restart would be by the conventional ring oscillator method, namely gradual amplification of the noise at the amplifier inputs until sufficient for one of the amplifiers to switch and for that change of level to ripple around the circuit and establish an oscillation. Since it has already been stated that a purpose of the present invention is provide an oscillator which starts quickly, thereby enabling micro-controller deep sleep mode to be entered more often, such a starting mechanism is deemed too slow and the arrangement includes additional circuitry as will now be described with reference to FIG. 2.

Figure 2:
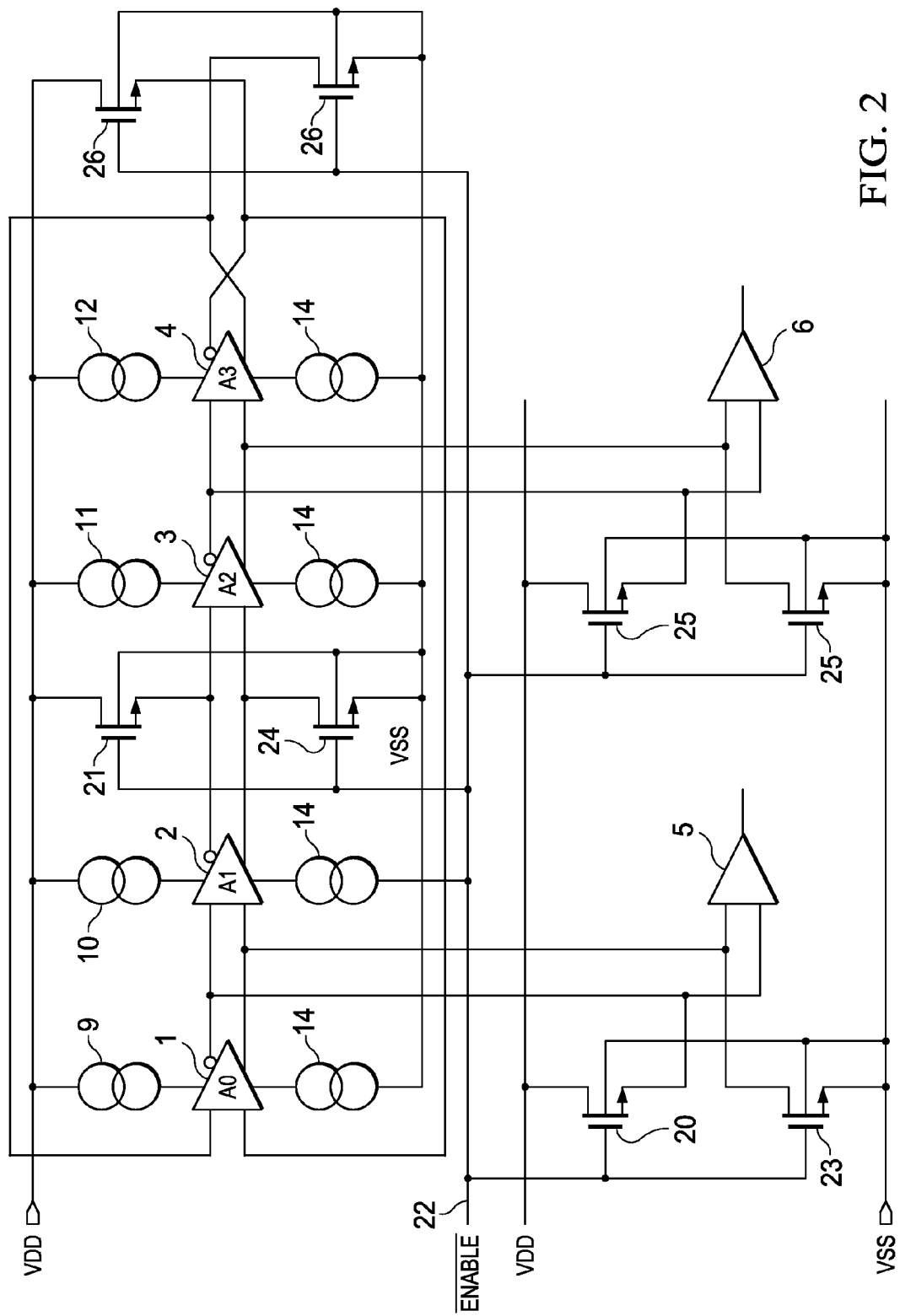
FIG. 2 shows part of the oscillator of FIG. 1 in more details.

FIG. 2 shows parts of the circuitry of FIG. 1 in greater detail and although some of the features of FIG. 1 have been symbolised in FIG. 2, common reference numerals have been used where parts are the same. It will be noted from FIG. 2 that the input of amplifier 2 (A1) may be clamped at a high level by turning on a transistor 20. Similarly, the output of the same amplifier 2 (A1) may be clamped at a high level by turning on a transistor 21. It will be observed that transistors 20 and 21 are controlled from a common input line 22 and as the conditions described above exist at the same time when the transistors 20 and 21 are on. Clearly, the imposed conditions are in conflict with the normal input and inverse output condition delivered by the inverting amplifier A1. Accordingly if the transistors were to be turned off with the bias supplies 10 and 14 in place, then the amplifier would immediately start to switch. It will be appreciated the onset of such switching does not rely on any kind of noise amplification as described above (and is the case in the Motorola patent mentioned in the preamble) but is forced by the imposition of initial conditions; moreover, those initial conditions are not conditions which are encountered by amplifier A1 in normal operation (as in is the case in the IBM patent mentioned in the preamble). Rather a completely different mode of operation is briefly entered where amplifier A1 sees the conditions experienced by a phase shift oscillator which continuously sees an input which conflicts with its present output and so is forced into oscillation. For symmetry, transistors 23 and 24 which are switched in common with force the opposite polarity input and the opposite polarity output of amplifier A1 to the opposite (low) conflicting states. It has been found important to start at least neighbouring stages of a multi-stage oscillator in this way since otherwise there has been found to be a risk of the noise—start mechanism taking over. It will be observed that the signal used to control the transistors 20, 21, 23 and 24 and which is applied in common to their control gate on line 22 is the inverse of the signal used to control the bias generators associated with the amplifiers A0,A1,A2 and A3. Thus, when the oscillator is not running, i.e. the bias generators are off because an enable signal is deasserted on line 18 (corresponding to a deep sleep of a micro-controller if such is present) line 22 applies the start up conditions (Enable/asserted) via transistors 20, 21, 23 and 24 to amplifier A1. When an enable signal is asserted on line 18 to establish supply to the amplifiers, so amplifier A1 is released from the enforced initial conditions and is able to start as described above.

It will be further observed that amplifiers A0, A2, and A3 also have similar initial conditions imposed upon them, A0 by virtue of transistor pairs 26 and 20, 23; A2 by virtue of transistor pairs 21, 24 and 25; and A3 by virtue of transistor pairs 25 and 26. Thus, when an enable signal is asserted all amplifiers are forced into transition, the action of the ring taking over only to synchronise them, not to start them.

Figure 3A:
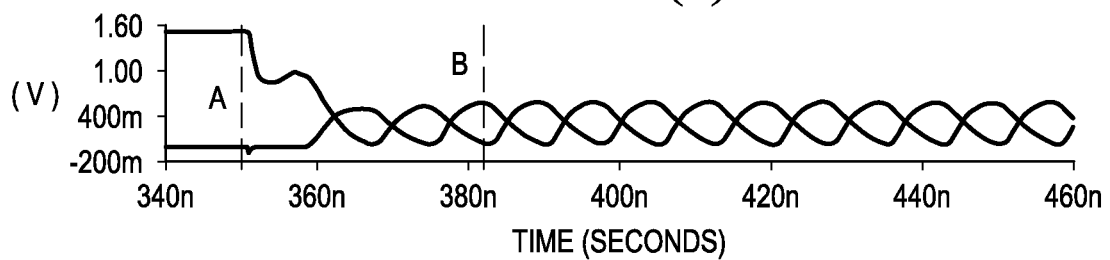
FIG. 3 depicts waveforms obtained from a realisation of the oscillator of FIGS. 1 and 2.
Figure 3B:
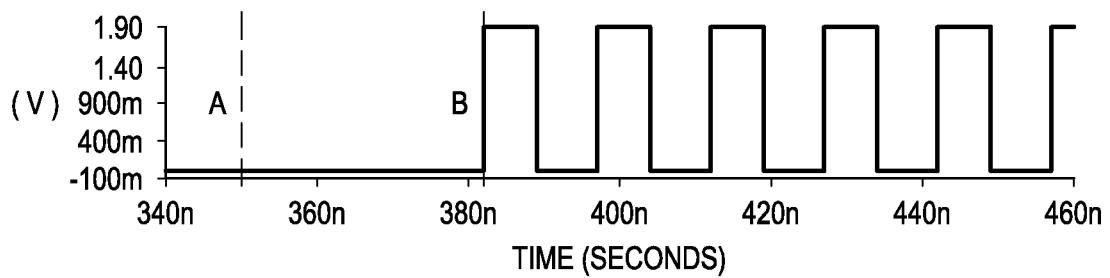
Figure 3C:
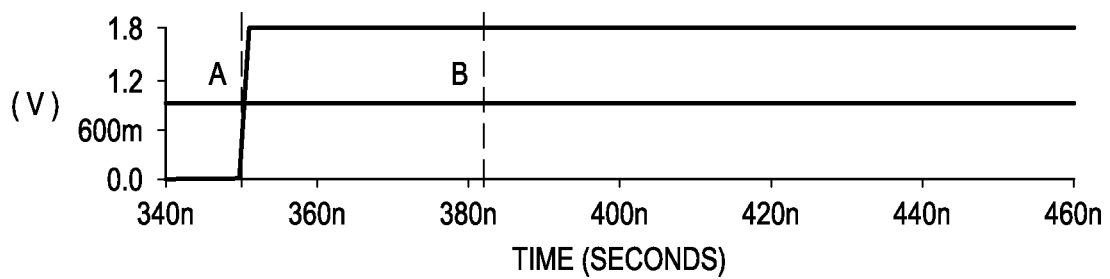

An oscillator in accordance with the present embodiment has been constructed and produces waveforms as set out in FIG. 3. The oscillator was designed for a clock phase period of a nominal 15 nS (66 2/3 MHz). In the Figure trace (a) represents the complimentary outputs of Amplifier A1, trace (b) the output of logic block 7 CLK0 clock phase and trace (c) the enable signal applied on line 18.

At time A (350 nS) the enable signal is asserted. After about 11 ns, amplifier A1 is in sustained oscillation. The CLK0 oupt of logic block 7 is inhibited for at least 4 cycles to ensure that all stages have synchronised and so clock phase CLK0 at 31 nS, whereupon the oscillator is fully started. Clearly, if fewer clock phases were required and as a consequence fewer stages employed than start up could be even faster. Nonetheless, this start up time of 31 nS is regarded as extremely fast by the applicant, in whose experience micro-controller clock oscillators would start in a period of some hundreds of microseconds. Even with the startup conditions completely removed from the circuit of the present embodiment so that a noise start-up occurred, the best that could be achieved was a start time of some 700 nS.

In an alternative embodiment of an oscillator in accordance with the present invention the enable signal is first passed to a threshold circuit before being used to enable the bias generators and release the initial conditions. The threshold circuit triggers when the bias generators have reached their operating point. In this way, it is ensured that the ring oscillator will start smoothly.

Although the invention has been described in detail, it should be understood that various changes, substitutions and alterations can be made thereto without departing from the spirit and scope of the invention as defined by the appended claims.

We claim:

1. Oscillator circuitry comprising a switching inverting amplifier arranged in a ring oscillator configuration of at least two stages;

a bias generator for supplying the amplifiers of neigbouring stages, said bias generator being responsive to an enable signal to supply the amplifiers when the enable signal is asserted and not to supply the amplifiers when the enable signal is deasserted, the enable signal being first passed through a threshold circuit before being used to enable bias generators and releasing initial conditions to ensure that the ring oscillator will start smoothly;

a first pair of transistors, one of said pair coupled to an input of one of the amplifiers and the other of said pair coupled to an output of said amplifier, said pair of transistors being driven in common by said enable signal such that when the enable signal is deasserted the transistors of the pair are turned on to impose conflicting levels at said input and said output such that said amplifier is forced to switch;

a second pair of transistors, one of said pair coupled to an input of the other of the amplifiers and the other of said pair coupled to an output of said other amplifier, said second pair of transistors being driven in common by said enable signal such that when the enable signal is deasserted the transistors of the pair are turned on to impose conflicting levels at said other amplifier input and said other amplifier output such that said other amplifier is forced to switch;

the neighbouring amplifiers providing said switching events to trigger ring oscillator oscillation thereafter.

2. Oscillator circuitry as claimed in claim 1 and comprising a plurality of switching inverting amplifiers in said ring oscillator configuration, each of said amplifiers having a like pair of associated transistors and being triggered to switch as aforesaid.

3. A Clock Generator including oscillatory circuitry as claimed in claim 1 wherein at least one clock phase is derived from an amplifier output and wherein generation of said clock phase ceases when said enable signal is deasserted to disable said bias generators.

4. A Clock Generator including oscillatory circuitry as claimed in claim 2 wherein at least one clock phase is derived from an amplifier output and wherein generation of said clock phase ceases when said enable signal is deasserted to disable said bias generators.

5. A micro-controller arrangement including a clock generator as claimed in claim 3 said micro-controller entering a deep sleep mode when generation of said clock phase ceases.

6. A micro-controller arrangement including a clock generator as claimed in claim 4 said micro-controller entering a deep sleep mode when generation of said clock phase ceases.

\* \* \* \* \*